(12) United States Patent
Sato

(10) Patent No.: US 6,888,618 B2
(45) Date of Patent: May 3, 2005

(54) EXPOSURE APPARATUS AND EXPOSURE METHOD

(75) Inventor: Mitsuya Sato, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 119 days.

(21) Appl. No.: 09/472,993

(22) Filed: Dec. 28, 1999

(65) Prior Publication Data

US 2003/0002021 A1 Jan. 2, 2003

(30) Foreign Application Priority Data

Dec. 28, 1998 (JP) ............................................ 10-373800

(51) Int. Cl.[7] ........................ G03B 27/54; G03B 27/72; G03B 27/42; A61N 5/00
(52) U.S. Cl. .............................. 355/67; 355/35; 355/53; 355/68; 250/206; 250/492.2; 250/492.22
(58) Field of Search .............................. 355/35, 53, 67, 355/68; 250/206, 492.2, 492.22

(56) References Cited

U.S. PATENT DOCUMENTS

| 5,004,348 | A | * | 4/1991 | Magome | ..................... 356/401 |
| 5,581,324 | A | * | 12/1996 | Miyai et al. | ................... 355/53 |
| 5,585,925 | A |   | 12/1996 | Sato et al. | ................... 356/401 |
| 5,591,958 | A | * | 1/1997 | Nishi et al. | ................. 250/205 |
| 5,608,492 | A |   | 3/1997 | Sato | ........................... 355/68 |
| 5,753,926 | A |   | 5/1998 | Sato | .......................... 250/548 |

* cited by examiner

Primary Examiner—Frank G. Font
Assistant Examiner—Khaled Brown
(74) Attorney, Agent, or Firm—Fitzpatrick, Cella, Harper & Scinto

(57) ABSTRACT

A scan type exposure apparatus wherein a pattern of an original is lithographically transferred to a substrate sequentially while the original and the substrate are scanningly moved relative to exposure light, the apparatus including a photodetector disposed at a position optically conjugate with the original, and a storing device for storing correction information with respect to an output of the photodetector, in relation to different positions of the original to be illuminated with the exposure light, such that, in the lithographic pattern transfer, the output of the photodetector can be corrected by use of the correction information.

20 Claims, 11 Drawing Sheets

EXPOSURE APPARATUS AND EXPOSURE METHOD

FIELD OF THE INVENTION AND RELATED ART

This invention relates to an exposure apparatus such as a semiconductor exposure apparatus of scan type, for example, and an exposure method and a device manufacturing method to be used therewith. More particularly, the invention is concerned with an exposure apparatus and an exposure method in which any influence of reflection light from a reticle or a wafer, for example, is removed by which accurate control of integrated exposure amount is enabled Scan type exposure apparatuses are known as an apparatus for manufacture of semiconductor devices, in which a pattern of a reticle is lithographically transferred onto a wafer through a scanning operation FIG. 13 is a schematic view of a main portion of an ordinary scan type semiconductor exposure apparatus. In this apparatus, as shown in the drawing, a portion of a pattern 200 formed on a reticle 50 is illuminated with slit-like illumination light 201, by use of a continuous emission light source or a pulse light emission light source. Through a projection optical system 60, an image of that portion of the pattern 200 is projected on the wafer 61 in a reduced scale. On the other hand, the reticle 50 and the wafer 61 are scanningly moved in opposite directions, as depicted by arrows 202 and 203, relatively to the projection optical system 60 and the slit-like illumination light 201, at a speed ratio corresponding to the reduction magnification. By this, the whole pattern on the surface of the reticle 50 is transferred to a single chip region or plural chip regions on the wafer 61.

In such semiconductor exposure apparatuses, in order to maintain constant the integrated exposure amount of a wafer as determined by the image plane illuminance and the scan speed, the image plane illuminance has to be kept constant. In order to meet such a requirement, in conventional scan type semiconductor exposure apparatuses, a photodetector is disposed at a position in an illumination system which is optically conjugate with the reticle, and an applied electric power to a discharge lamp is controlled so that an output of the photodetector becomes constant.

Such a technique, however, involves a problem that, even if the control is made to keep the output of the photodetector constant, the integrated exposure amount of a wafer cannot be made constant.

According to investigations made by the inventive entity of the subject application in connection with the precision in integrated exposure amount control of a scan type exposure apparatus, it has been found that a major factor for degradation of precision in integrated exposure amount control is reflection light from a reticle to a photodetector which is placed at a position conjugate with the reticle surface, for measurement of the illuminance upon the reticle (original) surface.

SUMMARY OF THE INVENTION

It is accordingly an object of the present invention to provide an exposure apparatus, an exposure method or a device manufacturing method, by which any influence of reflection light from a reticle is removed or reduced such that accurate control of the integrated exposure amount can be accomplished.

In accordance with an aspect of the present invention, there is provided a scan type exposure apparatus wherein a pattern of an original is lithographically transferred to a substrate sequentially while the original and the substrate are scanningly moved relative to exposure light, said apparatus comprising: a photodetector disposed at a position optically conjugate with the original; and storing means for storing correction information with respect to an output of said photodetector, in relation to different positions of the original to be illuminated with the exposure light, such that, in the lithographic pattern transfer, the output of said photodetector can be corrected by use of the correction information.

In accordance with another aspect of the present invention, there is provided an exposure method, comprising the steps of: lithographically transferring a pattern of an original sequentially to a substrate while scanningly moving the original and the substrate relative to exposure light; correcting, in the transfer of the pattern of the original to the substrate, an output of a photodetector disposed at a position optically conjugate with the original by use of predetermined correction information corresponding to different positions of the original to be illuminated with the exposure light.

In accordance with a further aspect of the present invention, there is provided a device manufacturing method, comprising the steps of: transferring, by exposure, a pattern of an original onto a substrate by use of an exposure apparatus such as described above, and developing the substrate having the pattern transferred thereto.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
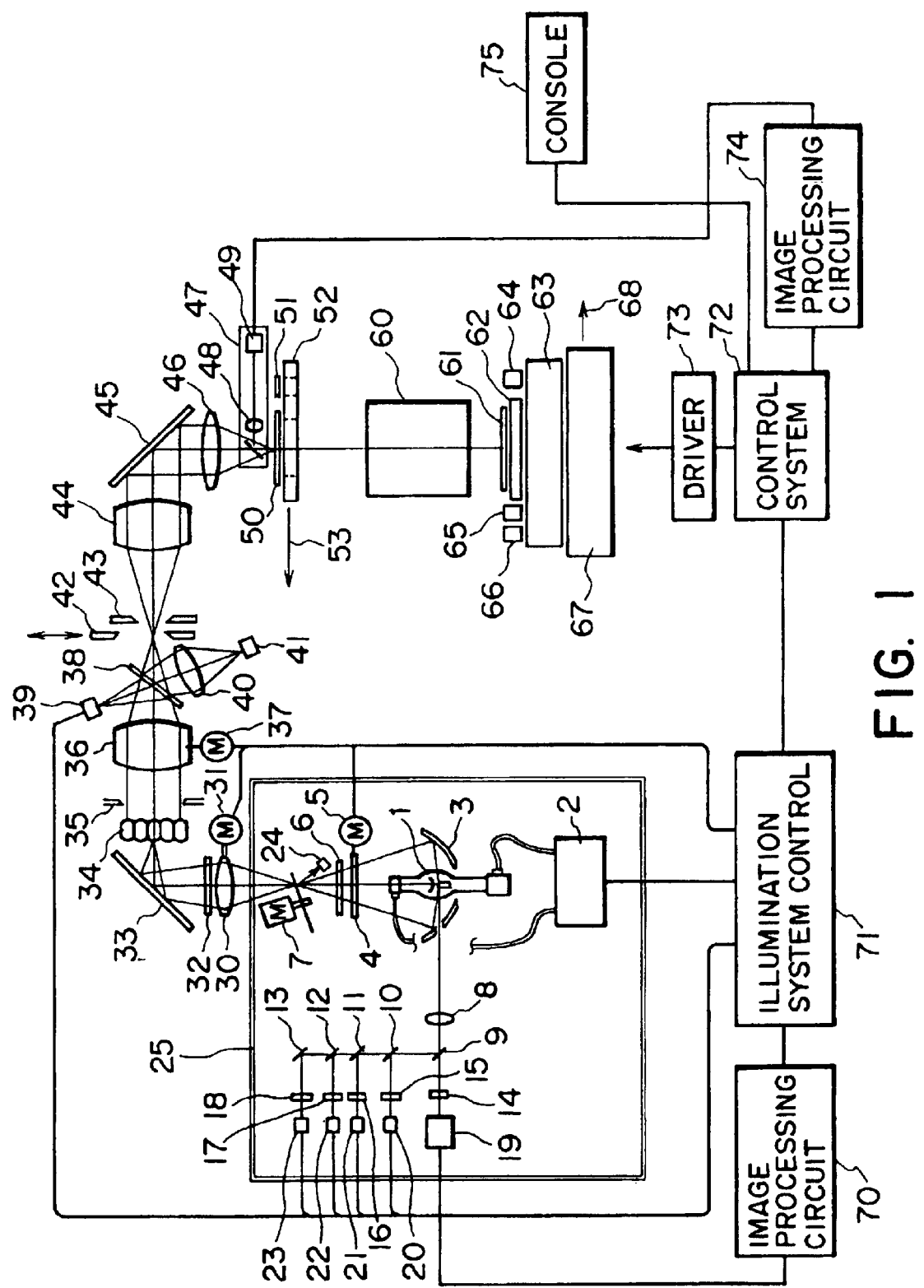
FIG. 1 is a schematic view of a semiconductor exposure apparatus according to an embodiment of the present invention.

In an exposure apparatus and an exposure method according to preferred embodiments of the present invention, a pattern of an original (reticle), as illuminated by an illumination optical system for illuminating the original with exposure light, is projected and printed on a substrate (wafer) through a projection optical system, wherein an output of a light source is controlled on the basis of an output of a photodetector disposed at a position which is optically conjugate with the pattern surface of the original. Specifically, any influence of reflection light from the pattern surface of the original is removed or reduced on the basis of an output of the photodetector produced as the pattern surface of the original is illuminated by the illumination optical system.

Such exposure apparatus and exposure method may be a scan type exposure apparatus and a scan type exposure method in which the exposure is performed while the original and the substrate are scanningly moved relatively to a slit-like illumination light from the illumination optical system and to the projection optical system. The light source may comprise a discharge lamp.

As a preparation, while an applied electric power to the discharge lamp may be kept constant and while the scan motion may be performed at a speed lower than an ordinary scan speed, outputs of the photodetector in relation to each movement positions may be obtained. During this procedure, an output of the photodetector in a state in which there is no light coming from the original and directed to the photodetector may be obtained. In an actual exposure process of the substrate, initially, at start of the scan motion, an output of the photodetector in a state in which there is no reflection light coming from the original and directed back to the photodetector may be obtained, and then, at each movement positions in the scan motion, any influence of reflection light may be removed or reduced on the basis of the above output and the outputs having been obtained beforehand. Also, the output of the light source may be controlled on the basis of an output of the photodetector with the influence of reflection light being removed or reduced.

Alternatively, as a preparation, while an applied electric power to the discharge lamp may be kept constant and while the scan motion may be performed at a speed lower than an ordinary scan speed, outputs of the photodetector and detection results of reflection light detecting means, for detecting reflection light from the pattern surface of the original, may be obtained in relation to each of the movement positions obtained. In an actual exposure process of the substrate, at each of the movement positions in the scan motion, any influence of reflection light may be removed or reduced on the basis of an output of the photodetector and a result of detection by the reflection light detecting means. Also, the output of the light source may be controlled on the basis of an output of the photodetector with the influence of reflection light being removed or reduced.

More specifically, the present invention provides the following two methods.

"Constant-Illuminance Designation at Reticle Positions"

A reticle surface illuminance detector may be disposed inside an illumination optical system. As regards a discharge lamp, in a case of constant input control, if the illuminance is measured in a short time such as several mSec. to several ten mSec., its variation is large. If, however, an integrated value in the unit of a few seconds is considered, it is relatively stable. For this reason, the discharge lamp may be lightened with a constant input, and a reticle stage may be scanningly moved slowly. The outputs of the reticle surface illumination detector in that period may be memorized. It there is no reflection light coming from the reticle surface and impinging on the reticle surface illumination detector, the output of the reticle surface illumination detector would be kept constant, regardless of the reticle position. If any variation is measured, it means that the change results from reflection light from the reticle. Therefore, in an actual exposure operation for a wafer, constant-illuminance control may be performed in synchronism with the reticle position, in accordance with a component with the variation based on the reticle position being removed.

"Correction with a Reticle Reflection Light Detector"

A reticle surface illuminance detector and a reticle reflection light detector may be disposed inside an illumination system. As regards a discharge lamp, in a case of constant input control, if the illuminance is measured in a short time such as several mSec. to several ten mSec., its variation is large. If, however, an integrated value in the unit of a few seconds is considered, it is relatively stable. For this reason, the discharge lamp may be lightened with a constant input, and a reticle stage may be scanningly moved slowly. The outputs of the reticle surface illuminance detector and the reticle reflection light detector in that period may be memorized. If there is no reflection light coming from the reticle surface and impinging on the reticle surface illumination detector, the output of the reticle surface illumination detector would be kept constant, regardless of the reticle position. Practically, however, the output of the reticle surface illuminance detector may change slightly with the reticle position. Here, if there is a particular ratio relation between the variation in output of the reticle reflection light detector and the variation in output of the reticle surface illuminance detector, regardless of the reticle position, it means that the influence of reflection light from the reticle, fixedly impinging on the reticle surface illuminance detector, can be detected on the basis of the output of the reticle reflection light detector. Namely, in ordinary wafer exposure the result of measurement by the reticle surface illuminance detector may be corrected on the basis of the result obtained by correcting, with the particular ratio, the variation in output of the reticle reflection light detector, such that an accurate reticle illuminance can be determined. Based on this value, constant-illuminance control may be performed.

Preferred embodiments of the present invention will now be described with reference to the accompanying drawings.

Figure 4:
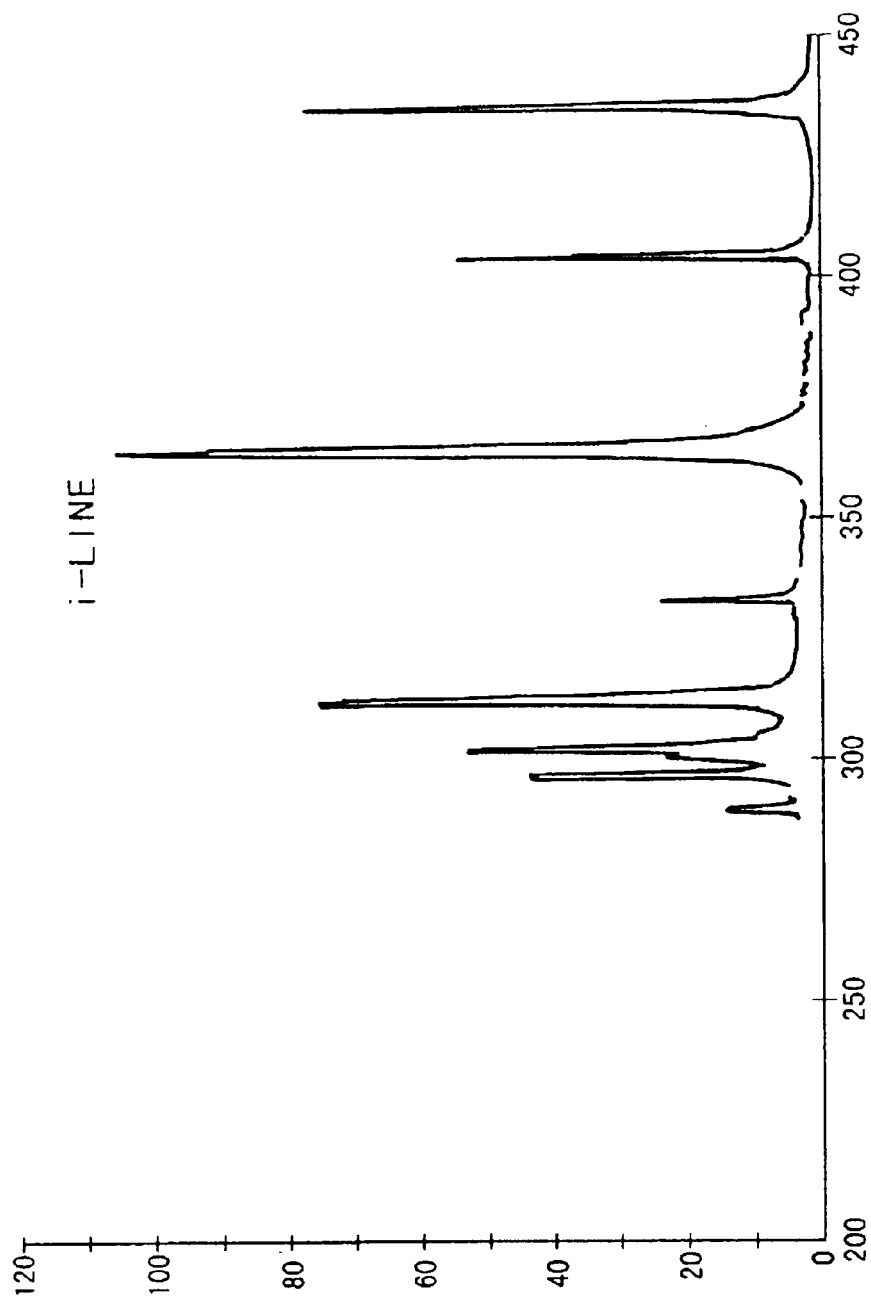
FIG. 4 is a graph for explaining a spectral output characteristic of an i-line lamp, in the apparatus of FIG. 1.

FIG. 1 shows the structure of a semiconductor exposure apparatus according to an embodiment of the present invention. Denoted in the drawing at 1 is a discharge lamp which comprises an i-line lamp having a spectral output characteristic such as shown in FIG. 4. Denoted at 2 is a powering device which is a power source for the i-line lamp 1 Denoted at 3 is an elliptical mirror for collecting light from the i-line lamp 1. Denoted at 4 is a blocking plate for intercepting the light, during a period in which the operation of the semiconductor exposure apparatus is stopped. Denoted at 5 is a motor for driving the blocking plate 4. Denoted at 6 is a middle-band i-line filter of about a few tens nm. Denoted at 7 is a high-speed exposure shutter which performs opening and closing motion for every single shot exposure operation, in an ordinary exposure process. Denoted at 8 is a arc monitor imaging lens, and denoted at 9–12 are half mirrors. Denoted at 13 is a mirror, and denoted at 14 and 15 are narrow-band i-line filters. Denoted at 16 is a middle-band i-line filter, and denoted at 17 is a narrow-band g-line filter. Denoted at 18 is a broad-band filter having a spectral transmissivity substantially equivalent to the spectral reflectivity of the elliptical mirror 3. Denoted at 19 is a CCD camera for measuring the arc shape. Denoted at 20–23 are photodetectors each for measuring a light energy passed through the narrow-band i-line filter 15, the middle-band i-line filter 16, the narrow-band g-line filter 17 or the broad-band filter 18. These filters will therefore be referred to as a narrow-band i-line detector, a middle-band i-line detector, a narrow-band g-line detector and a broad-band detector, respectively. Denoted at 24 is a photodetector for measuring reflection light from the high-speed exposure shutter 7. Denoted at 25 is a lamp house for accommodating the components 1–24 described above therein.

Denoted at 30 is a first zoom lens for imaging the arc shape of the i-line lamp 1 at a front end of a fly's eye lens, in an optimum size. Denoted at 31 is a motor for actuating the zoom lens 30. Denoted at 32 is a narrow-band i-line filter having a bandwidth, of a few nm, which finally determines the exposure wavelength. Denoted at 33 is mirror, and denoted at 34 is a fly's eye lens. Denoted at 35 is a stop for setting the numerical aperture (NA) and the pupil shape of the illumination system. Denoted at 36 is a second zoom lens for adjusting the illuminance distribution at a central portion and a peripheral portion of the reticle surface, and denoted at 37 is a motor for actuating the second zoom lens 36. Denoted at 38 is a parallel flat plate for introducing about 1% of the light from the second zoom lens 36, into a photodetector 39. The photodetector 39 serves as a reticle surface illuminance detector, and it is disposed at a position conjugate with the central portion of the reticle surface. Denoted at 40 is a condenser lens for collecting reflection light from the reticle surface, and denoted at 41 is a reticle reflection light detector for measuring any reticle reflection light as collected by the condenser lens 40. Denoted at 42 is a masking blade which is movable in directions depicted by an arrow, for restricting an exposure region upon the reticle, in a scan direction. Denoted at 43 is a slit for defining a slit-like exposure region upon the reticle. Denoted at 44 and 46 are condenser lenses, and denoted at 45 is a mirror.

Denoted at 47 is a microscope for measuring a pattern image on the reticle surface or the wafer surface. It is made movable to be retracted outwardly of the exposure light position. Denoted at 48 is an imaging lens of the microscope 47, and denoted at 49 is a CCD camera. Denoted at 50 is a reticle, and denoted at 51 is a dummy reticle having the same thickness as the reticle 50. Denoted at 52 is a reticle stage for carrying the reticle 50 and the dummy reticle 52 thereon. The reticle stage can be scanningly moved in a direction of an arrow 53.

Denoted at 60 is a projection lens for projecting, in a reduced scale, a pattern of the reticle 50 onto a certain position upon the top face of a wafer 61. Denoted at 62 is a wafer chuck for holding the wafer 61 through vacuum attraction. Denoted at 63 is a θ-Z stage for moving the wafer chuck 62 in a vertical direction and a tilt direction so as to bring the top surface of the wafer 61 into coincidence with the image plane of the projection lens 60. Denoted at 64 is an illuminance non-uniformness measuring device which can be mounted on the θ-Z stage 63. Denoted at 65 is a reference mark block which is mounted on the θ-Z stage 63. Denoted at 66 is a reticle diffraction light sensor, being mounted on the θ-Z stage 63. Denoted at 67 is a wafer stage for moving the θ-Z stage 63 in a scan direction 68 and also in a direction orthogonal to the scan direction.

Denoted at 70 is an image processing system for measuring the arc shape of the i-line lamp 1. Denoted at 71 is an illumination system control system, and denoted at 72 is a general control system for the semiconductor exposure apparatus. Denoted at 73 is a driver means for moving the reticle stage 52, the θ-Z stage 63 or the wafer stage 67 in response to a driving signal from the general control system 72. Denoted at 74 is an image processing system for measuring the pattern image on the reticle surface or the wafer surface. Denoted at 75 is a console which is an operating unit for the semiconductor exposure apparatus.

Figure 2A:
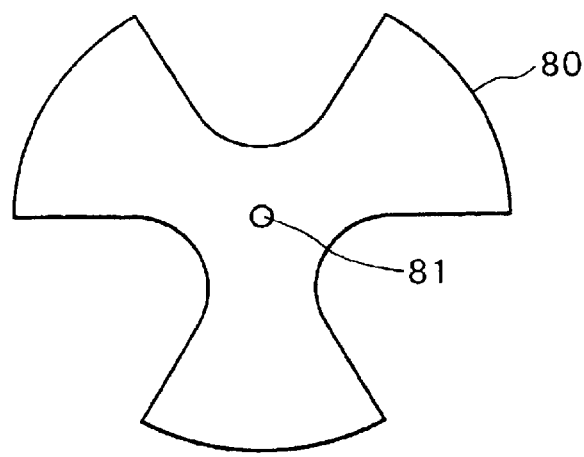
FIGS. 2A and 2B are schematic views, respectively, for explaining details of a high-speed exposure shutter in the apparatus of FIG. 1.
Figure 2B:
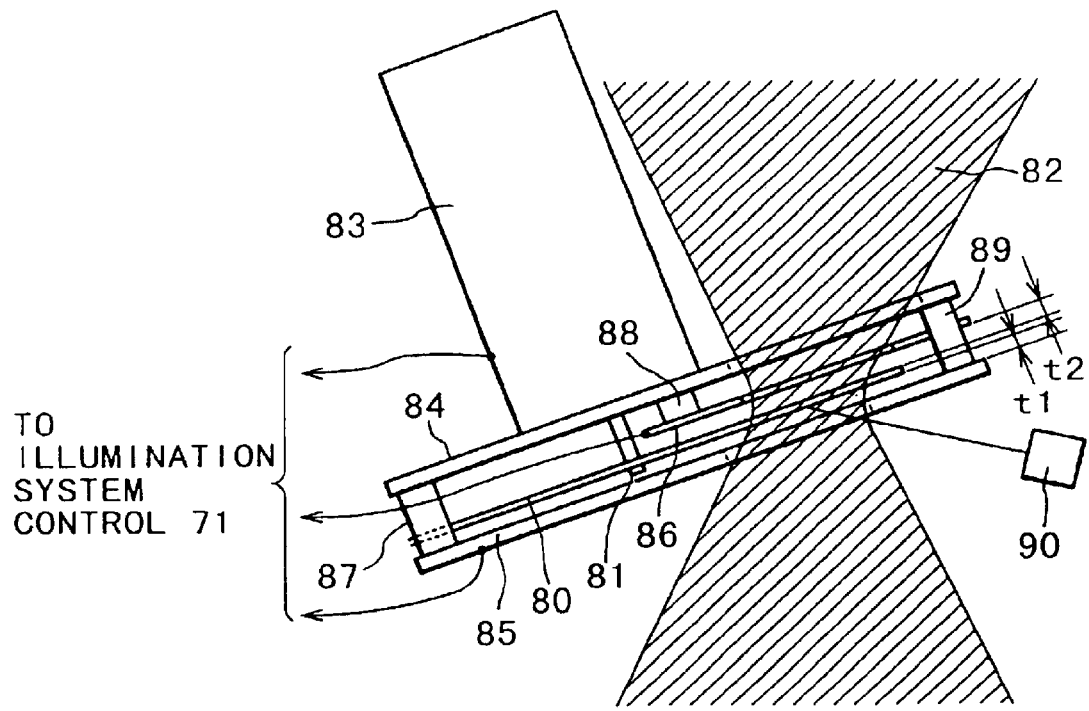

FIGS. 2A and 2B show details of the high-speed exposure shutter 7, wherein FIG. 2A illustrates the shape of the shutter blade and FIG. 2B illustrates the structure of the high-speed exposure shutter 7. Denoted in these drawings at 80 is a shutter blade made of a metal material having an electric conductivity, and it is rotatably movable to intercept and pass the exposure light. Denoted at 81 is a rotary shaft of the shutter blade 80. Denoted at 82 (hatched portion) is exposure light. Denoted at 83 is an AC servo motor for rotationally driving the shutter blade 80, and denoted at 84 is a motor fixing plate. Denoted at 85 and 86 are blocking plates made of a metal material having an electric conductivity, and they are disposed to sandwich the shutter blade 80 therebetween. Denoted at 87–89 are spacers for holding the blocking plates 85 and 86 while electrically insulating them from the motor fixing plate 84. Denoted at 90 is a non-contact type thermometer.

Figure 3:
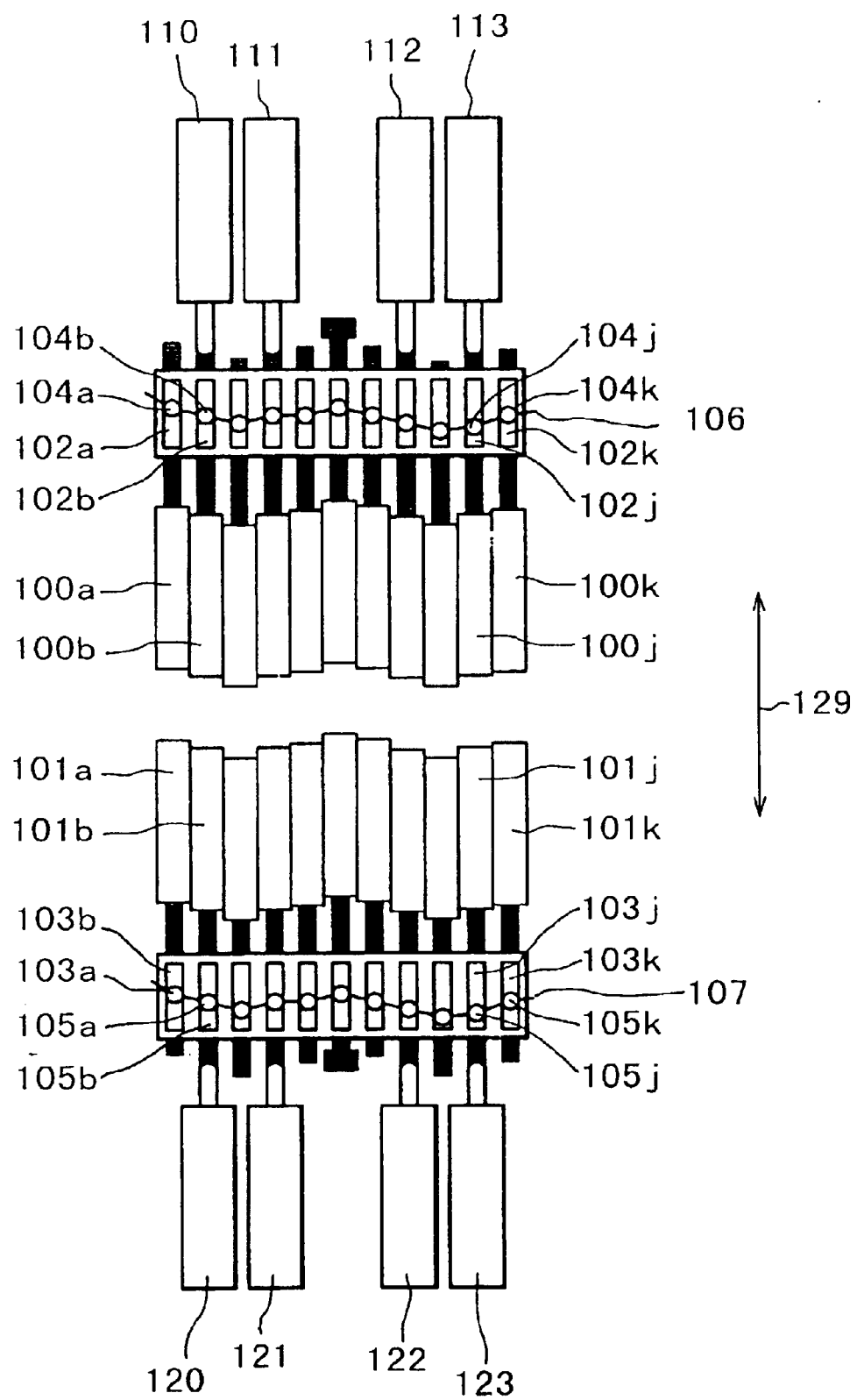
FIG. 3 is a schematic view, for explaining details of a variable slit portion in the apparatus of FIG. 1.

FIG. 3 shows details of the variable slit portion 43. Denoted in the drawing at $100a$–$100k$ and $101a$–$101k$ are upper slit plates and lower slit plates which are movable in directions depicted by an arrow 129. Denoted at $102a$–$102k$ and $103a$–$103k$ are guides for these slit plates. Denoted at $104a$–$104k$ and $105a$–$105k$ are rotatable protrusions which are movable integrally with the slit plates. Denoted at 106 and 107 are spring plates extending through the rotatable protrusions to connect the slits to each other. Denoted at 110–113 and 120–123 are motors for driving particular slit plates.

FIG. 4 illustrates the spectral output characteristic of the i-line lamp 1. In the semiconductor exposure apparatus of this embodiment, in the spectral output, only the i-line portion about 365 nm as illustrated is extracted by means of the narrow-band i-line filter 32 and it is used. Here, the spectral output about 436 nm as illustrated is called "g-line".

Figure 5:
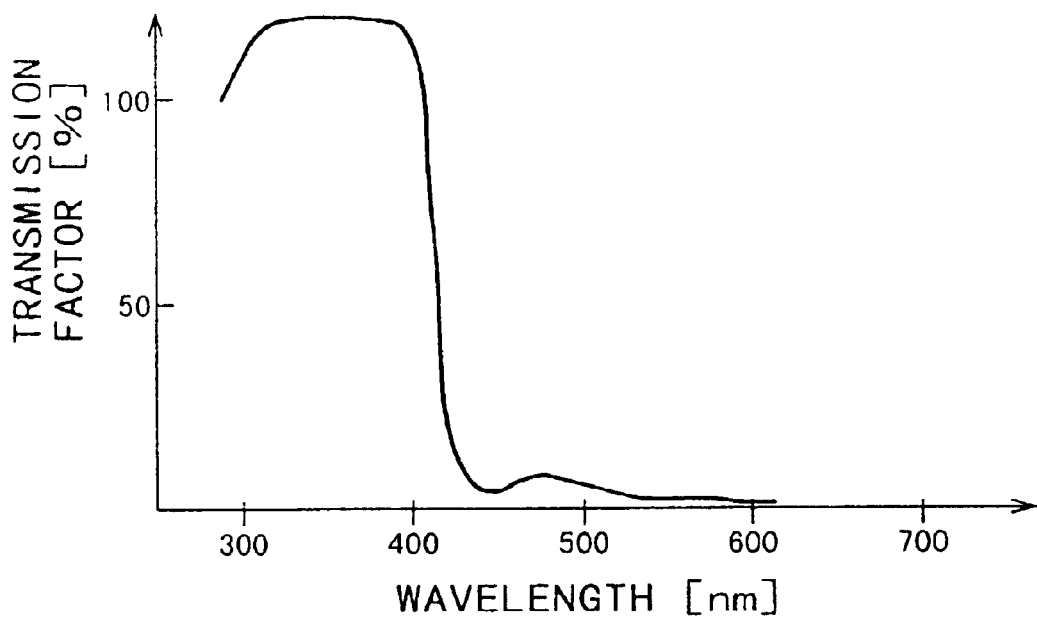
FIG. 5 is a graph for explaining a spectral reflectivity of an elliptical mirror 3, in the apparatus of FIG. 1.

FIG. 5 shows the spectral reflectivity of the elliptical mirror 3. The elliptical mirror 3 has such a characteristic that only light of about 320–400 nm is reflected thereby.

Figure 6:
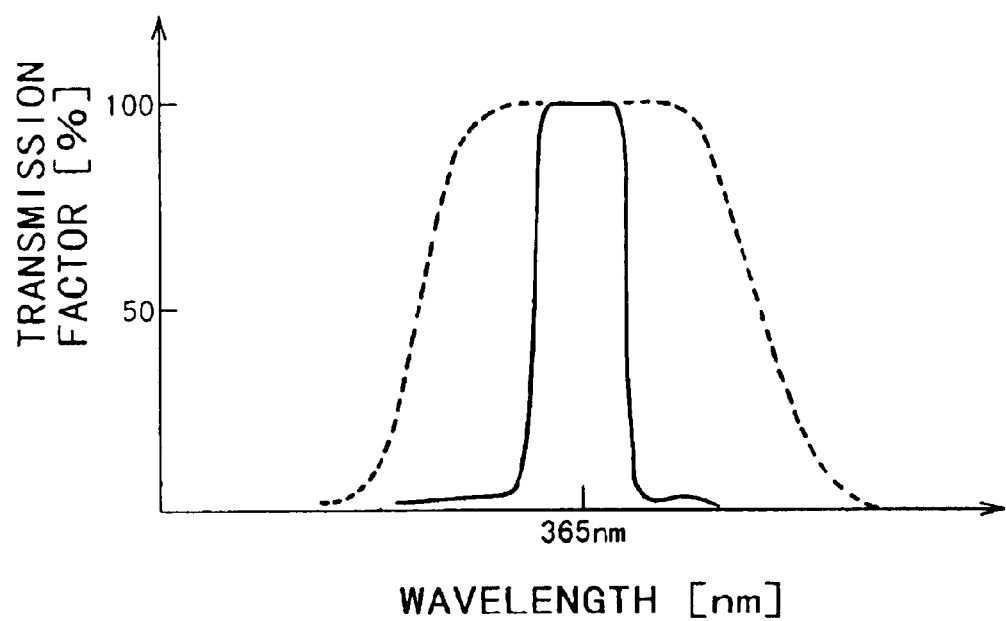
FIG. 6 is a graph, for explaining interception characteristics of a middle-band i-line filter and a narrow-band i-line filter, in the apparatus of FIG. 1.

In FIG. 6, the broken line and the solid line depict the interception characteristics of the middle-band i-line filter 6 and the narrow-band i-line filter 32, respectively. The interception characteristic of the middle-band i-line filter 6 is equivalent to that of the narrow-band i-line filter 32 when the same is expanded by a few tens of nm.

Figure 7:
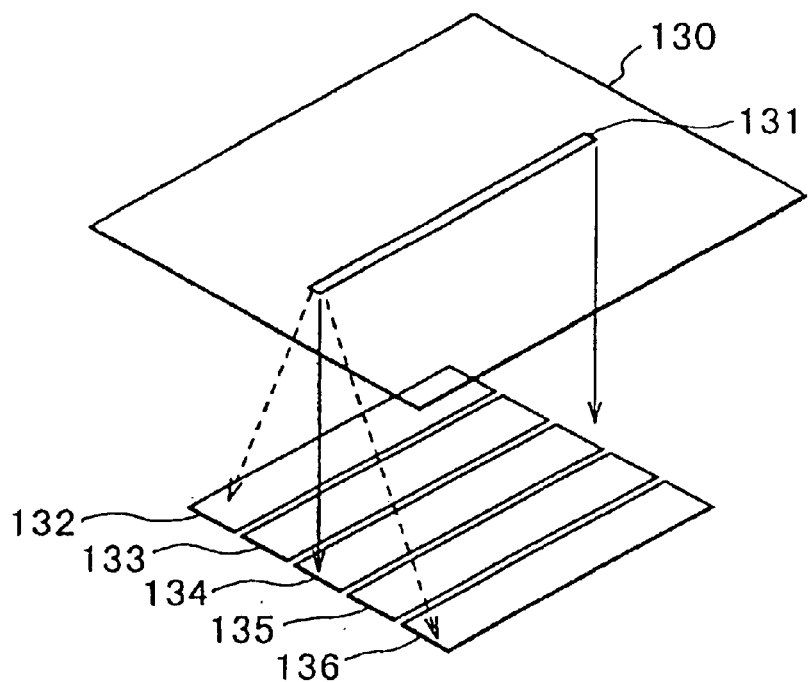
FIG. 7 is a perspective view of a reticle diffraction light sensor 66, in the apparatus of FIG. 1.

FIG. 7 is a perspective view, showing the structure of the reticle diffraction light sensor 66. Denoted in the drawing at 130 is a slit plate which can be moved toward the image plane of the projection lens 60 by the θ-Z stage 63. Denoted at 131 is a slit of a width of about 0.3 mm, and having a length substantially the same as that of the exposure slit. Denoted at 132–136 are photodetectors for detecting diffraction light from the reticle.

Figure 8:
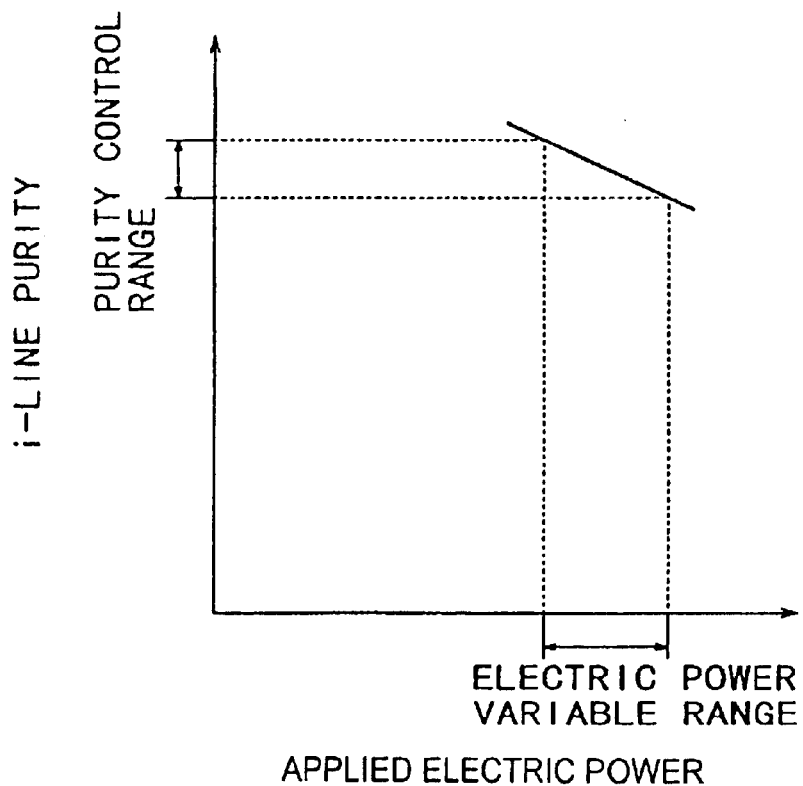
FIG. 8 is a graph, for explaining the relation between an applied electric power to the i-line lamp and the purity, in the apparatus of FIG. 1.

FIG. 8 shows the relation between an applied electric power to the i-line lamp and the i-line purity (i.e., the proportion of the i-line energy to the whole energy). As shown in the drawing, if the applied electric power to the i-line lamp is increased, the purity decreases.

Figure 9B:
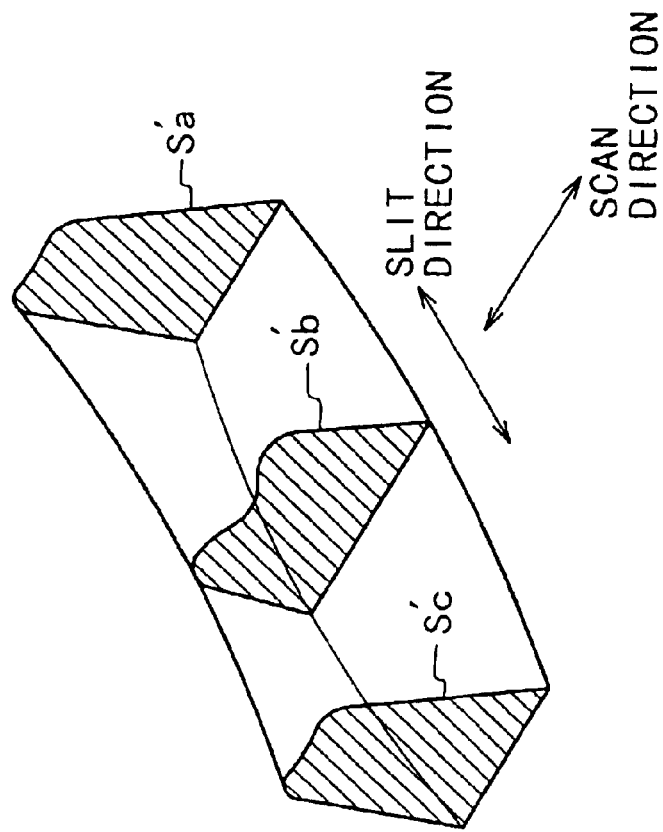
FIGS. 9A and 9B are schematic views, respectively, for explaining an illuminance distribution inside a slit, in a conventional structure and in the apparatus of FIG. 1.
Figure 9A:
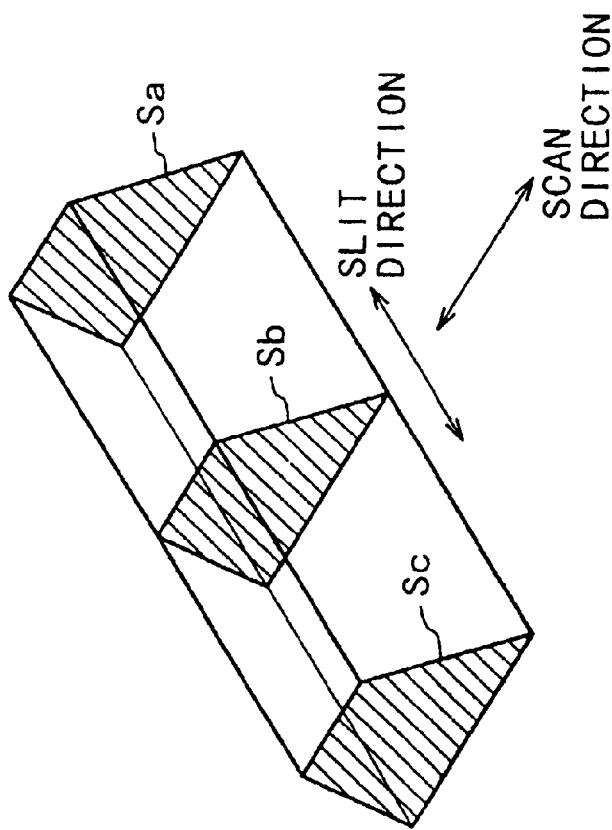

FIG. 9A shows an illuminance distribution inside a slit, in a conventional semiconductor exposure apparatus. Idealistically, the same illuminance distribution in the scan direction is defined at every position along the scan direction (i.e., the same shape is defined at Sa, Sb and Sc).

FIG. 9B shows an illuminance distribution inside a slit, in a semiconductor exposure apparatus of this embodiment. By means of the second zoom lens 36 and the variable slit 43, a slit shape and an illuminance distribution necessary for reducing astigmatism, produced inside the projection lens 60 during the exposure, can be provided.

Figure 10A:
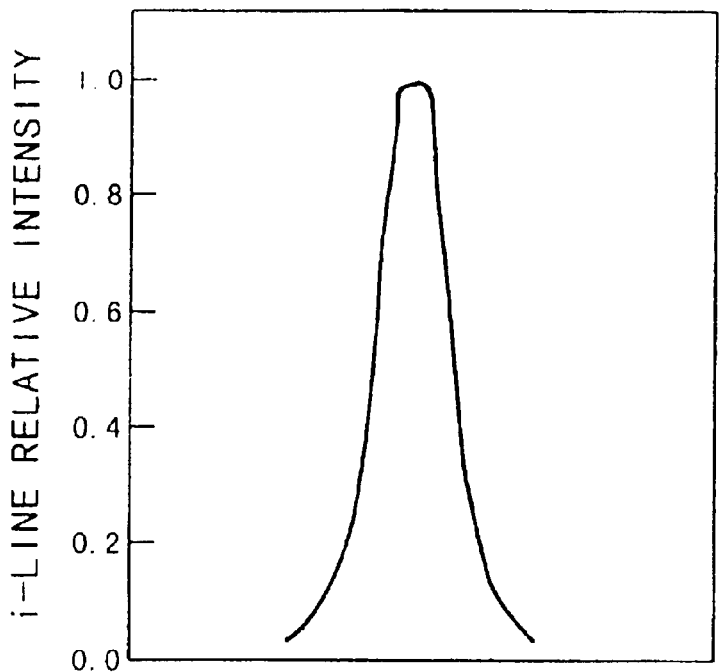
FIGS. 10A and 10B are graphs, respectively, for explaining an i-line intensity distribution in a radial direction and an electrode direction of the i-line lamp, in the apparatus of FIG. 1
Figure 10B:
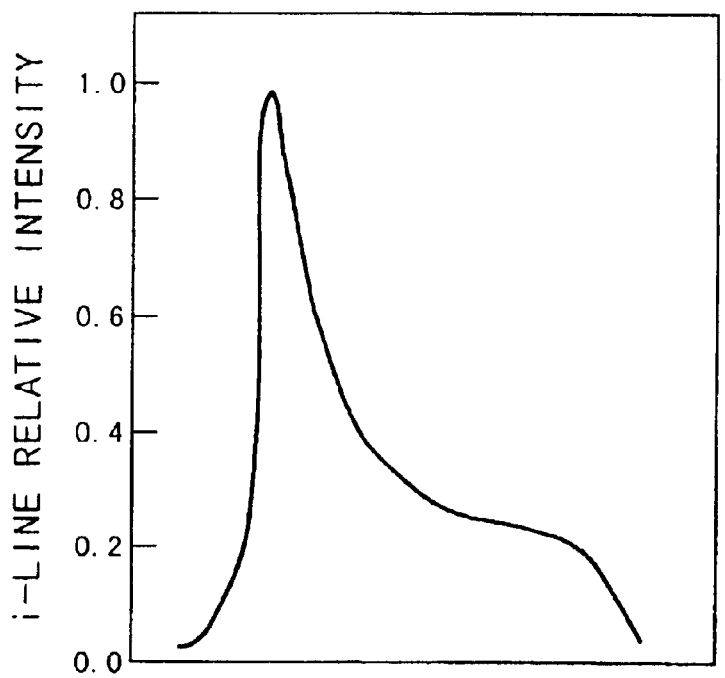

FIGS. 10A and 10B show i-line intensity distributions along a radial direction and an electrode direction of the i-line lamp 1, respectively. The illumination system of this embodiment is arranged so that the i-line intensity distribution in the radial direction as shown in FIG. 10A is projected to the entrance side of the fly's eye lens 34 by means of the zoom lens 30.

A semiconductor exposure apparatus of this embodiment has additional functions as compared with a conventional semiconductor exposure apparatus, as follows.

(A) Detecting any disorder of the i-line lamp.
(B) Correcting the arc shape of the i-line lamp.
(C) Improving the durability of the narrow-band i-line filter and the high-speed exposure shutter.
(D) Controlling the purity of the i-line lamp
(E) Detecting the reflectivity of the exposure shutter blade.
(F) Detecting any deformation of the exposure shutter blade.
(G) Reducing astigmatism aberration.
(H) High-precision control of integrated exposure amount.

These functions will be explained below, respectively, in detail.

(A) Detecting Any Disorder of the i-line Lamp:

In the semiconductor exposure apparatus of this embodiment, as shown in FIG. 1, the narrow-band i-line detector 20 and the narrow-band g-line detector 22 are accommodated in the lamp house 25. In accordance with the operation made by a CPU (not shown) inside the illumination system control 71, after the i-line lamp 1 is turned on and the discharge of the i-line lamp 1 becomes stable, analog signal outputs of the respective detectors are picked up at intervals of a few mSec. These signals are digitalized by an A/D converter (not shown), and then they are stored into a memory (not shown) as measurement data. In parallel to the above-described operations the CPU continuously performs the following discriminations in regard to the measurement data from the detectors, having been stored into the memory (1) Whether or not the measurement data of the detectors is inside a predetermined tolerable range;
(2) Whether or not any variation in the measurement data of the detectors is inside a predetermined tolerable range; and
(3) Whether or not the ratio of the measurement data of the detectors is inside a predetermined tolerable range.

If, as a result of these discriminations, any disorder is detected by the CPU, an i-line lamp extinction signal is promptly applied to the lighting device 2 and, additionally, the disorder is signaled to the general control 72. In response to reception of this disorder signal, the general control 72 stops the operation of the apparatus, and a corresponding alarm and display is presented. With the operation described above, the possibility of continued execution of an incomplete exposure process is prohibited. Also, damage of the i-line lamp 1 can be avoided.

(B) Correcting the Arc Shape of the i-line Lamp:

Like the semiconductor exposure apparatus of this embodiment, a conventional semiconductor exposure apparatus includes a variable stop 35 having a variable aperture diameter, being disposed inside the illumination system. The arc of the i-line lamp 1 is projected to a portion of the fly's eye lens 34 corresponding to the size of this stop, while the arc size is appropriately adjusted by the zoom lens 30. However, as shown in FIGS. 10A and 10B, the arc shape and size of the i-line lamp 1 is not always constant, due to differences in manufacturer, in article (manufacturing error), or in applied electric power, for example. Thus, with the conventional method, the light of the i-line lamp can not always be used effectively and stably. In consideration of it, in the semiconductor exposure apparatus according to this embodiment of the present invention, as shown in FIG. 1, a CCD camera 19 is provided inside the lamp house 25 so that the arc shape of the i-line lamp 1 can be measured in a horizontal direction. The arc shape and size are measured, after the i-line lamp 1 is turned on and the discharge thereof is stabilized.

The actual measurement is performed by use of the image processing system 70. More specifically, in response to an input of an arc image applied from the CCD camera 19, the image processing system 70 determines a highest luminous point position in the image, and it detects the intensity distribution at that position along the horizontal direction. The intensity distribution may be such as shown in FIG. 10A. Subsequently, the image processing system 70 calculates a half bandwidth (half width at peak) of this intensity distribution, and applies it to the illumination system control 71 as an arc radius value. In response to reception of this arc radius value, a CPU (not shown) inside the illumination system control 71 compares it with an arc radius value of a reference i-line lamp If the same is concluded as not being optimum, the control 71 actuates the zoom lens 30 so that the arc of optimum size is projected on the light entrance end of the fly's eye lens 34.

The semiconductor exposure apparatus of this embodiment performs the above-described operation continuously. Thus, even if the applied electric power to the i-line lamp 1 and thus the arc shape thereof are changed, in the constant-illuminance mode, for example, an optimum arc shape can be projected automatically onto the light entrance end of the fly's eye lens 34.

(C) Improving the Durability of the Narrow-band i-line Filter and the High-speed Exposure Shutter:

In the semiconductor exposure apparatus of this embodiment, the exposure light is provided as follows. Of the light from the i-line lamp 1 having a spectral output characteristic such as shown in FIG. 4, light in a range of 320–400 nm is extracted by using an elliptical mirror having a long-wavelength intercepting characteristic such as shown in FIG. 5. Then, by using the middle-hand i-line filter 6 as depicted by a broken line in FIG. 6, light of a few tens nm bandwidth adjacent to the i-line is extracted. Furthermore, by using the narrow-band i-line filter 32 depicted by a solid line in FIG. 6, light of a few nm bandwidth adjacent to the i-line is extracted. Thus, only light of a bandwidth range very close to the practical exposure light impinges on the shutter blade 80 or the narrow-band i-line filter 32. Since the shutter blade 80 and the narrow-band i-line filter 32 receive only a smallest required energy, the durabilities of the blade 80 and the filter 32 are prolonged significantly.

(D) Controlling the Purity of the i-line Lamp:

In the semiconductor exposure apparatus of this embodiment, the electric power control for the i-line lamp 1 (conventionally, it is independent from a job) can be set from the console 75, in relation to each jobs. Specific examples for the electric power control method may be as follows.

(1) Constant-Input Mode

Like a conventional constant-input mode, an applied electric power to the i-line lamp 1 is specified. While the purity becomes substantially constant, the purity measurement or the like is not performed.

(2) Constant-Illuminance Mode

Like a conventional constant-illuminance mode, an image plane illuminance is specified. However, since the applied electric power to the i-line lamp 1 is controlled so that the illuminance becomes constant, the purity will change. The timing for changing the applied electric power can be specified in relation to each wafer or each job.

(3) Constant-Purity Mode

This is a mode added in the semiconductor exposure apparatus of this embodiment. The purity of the i-line lamp 1 is specified. The applied electric power is controlled on the basis of the purity measurement, to maintain the specified purity. The timing for changing the applied electric power can be specified in relation to each wafer or each job.

The constant-purity mode in Item (3) above, which is added in this embodiment, will be explained in detail. As shown in FIG. 1, the semiconductor exposure apparatus of this embodiment is provided with a middle-band i-line detector 21 for measuring light of about i-line wavelength plus/minus 10 nm, and a narrow-band i-line detector 20 for measuring light of about i-line wavelength plus/minus a few nm. Through the operation of the CPU (not shown) inside the illumination system control 71, after the i-line lamp 1 is turned on and after the discharge of the i-line lamp becomes stable, analog signal outputs of the respective detectors are picked up at intervals of a few mSec. These signals are then digitalized by an A/D converter (not shown), and thereafter calculation of a ratio of measurement data of the detectors, that is, purity calculation, is performed. If the result of purity calculation is beyond a tolerable range set with respect to a predetermined purity, at a specified timing, the applied electric power to the i-line lamp 1 may be controlled within the tolerable range for the applied electric power, whereby a target purity can be accomplished. If the applied electric power for attaining the specified purity is beyond the tolerable range for the applied electric power, a failure of continued exposure operation is signaled to the general control 72. In response to reception of that signal, the general control 72 stops the operation of the apparatus, and presents an alarm and display.

(E) Detecting the Reflectivity of the Exposure Shutter Blade:

The semiconductor exposure apparatus of this embodiment has an exposure shutter protecting function, as has been described with reference to "(C) Improving the durability of the narrow-band i-line filter and the high-speed exposure shutter:". However, the protection is not complete, because there is a possibility that impurities are mixed into a cooling air for the shutter blade 80, which impurities may be deposited on the surface of the shutter blade 80 to cause a decrease of the surface reflectivity of the shutter blade 80 and an increase of thermal absorption.

In consideration of it, the semiconductor exposure apparatus of this embodiment is provided with a broad-band detector 23, for directly detecting a wavelength in the same bandwidth region as the light to be collected by the elliptical mirror 3, as well as a photodetector 24 for detecting reflection light from the shutter blade 80. Through the operation of the CPU (not shown) inside the illumination system control 71, after the i-line lamp 1 is turned on and after the discharge of the i-line lamp becomes stable, and when the blocking plate 4 is in its open state, analog signal outputs of the respective detectors are picked up at intervals of a few mSec. These signals are then digitalized by an A/D converter (not shown), and thereafter calculation of a ratio of measurement data of the detectors, that is, calculation of the surface reflectivity of the shutter blade 80, is performed. If the result of surface reflectivity calculation is beyond a tolerable range met with respect to a value, an i-line lamp 1 extinction signal is promptly supplied to the lighting device 2. Also, this disorder is signaled to the general control 72. In response to reception of that signal, the general control 72 stops the operation of the apparatus, and presents an alarm and display.

(F) Detecting any Deformation of the Exposure Shutter Blade:

In the semiconductor exposure apparatus of this embodiment, in connection with the exposure shutter 7, detection of any contact of the shutter blade with any surrounding member is performed, in addition to the protection described above. This is because deformation of the shutter blade may be caused by, in addition to thermal deformation described above, incorrect maintenance by a user or a service person, an error in manufacture, or a mechanical damage during transportation, for example. In this embodiment, as shown in FIG. 2, the shutter blade 80 is made of a metal material having an electric conductivity and, also, the blocking plates 85 and 86 adjacent to the opening are made of an electrically conductive metal material. These components are held in electrically isolated state, by use of spacers 87, 88 and 89 of electrically insulative material. On the other hand, the CPU (not shown) inside the illumination system control 71 continuously monitors any electric contact between the shutter blade 80 and the blocking plate 85 or 86. If any electric contact is detected, an i-line lamp extinction signal is promptly supplied to the lighting device 2. Also, this disorder is signaled to the general control 72. In response to reception of that signal, the general control 72 stops the operation of the apparatus, and presents an alarm and display. In this embodiment, in consideration of the difficulty of providing direct electric connection to the shutter blade 80, any electric contact between the housing of the AC servo motor 83 shown in FIG. 2 and the blocking plate 85 or 86 is detected.

(G) Reducing Astigmatism Aberration

The semiconductor exposure apparatus of this embodiment has a function for reducing astigmatism of a projection lens, to be produced during the exposure process. In this embodiment, at the stage of projection lens designing, a slit shape as well as an illuminance distribution inside a slit effective to minimize the production of astigmatism due to execution of the exposure process are determined in relation to each of the illumination modes, and they are reproduced and accomplished in the semiconductor exposure apparatus.

FIG. 9A shows an example of a slit shape and an illuminance distribution inside a slit, in a conventional semiconductor exposure apparatus. As seen from the drawing, generally in conventional semiconductor exposure apparatuses, the same illuminance distribution in the scan direction is defined at every point on the slit. Namely, substantially the same shape is defined at Sa, Sb and Sc in FIG. 9A. This is to accomplish uniformness of integrated exposure amount in the slit direction.

Further, in some conventional semiconductor exposure apparatuses, the slit width at each point on the slit is made variable so that the same illuminance integrated amount can be provided in the scan direction. This is to accomplish uniformness of integrated exposure amount in the slit direction. On that occasion, substantially the same area is defined at Sa, Sb and Sc in FIG. 9A.

The semiconductor exposure apparatus of this embodiment has a similar structure as of the conventional examples described above. However, it functions in a completely different way. In the semiconductor exposure apparatus of this embodiment, the slit shape and the illuminance distribution inside a slit can be set as desired. With this function, astigmatism or the like to be produced during the exposure process can be reduced.

FIG. 9B shows an example of an optimum slit shape and illuminance distribution inside a slit, effective to reduce exposure astigmatism, in relation to a certain illumination mode. In the slit illumination as illustrated, in a lens close to a reticle or a wafer, the light energy density of the light passing through a portion about the lens center is lowered such that, within a region through which the light passes, there does not occur a large temperature difference between the lens central portion and the peripheral portion.

Production of exposure astigmatism depends on the reticle surface illuminance, the reticle transmissivity and the reticle average diffraction efficiency. In consideration of it, in this embodiment, measured values of them are also used in determination of the slit shape and the illuminance distribution inside a slit. Details of this will be described below.

FIG. 7 is a perspective view, showing the structure of a reticle diffraction sensor 66, mounted on the θ-Z stage 63. The reticle diffraction sensor 66 serves to measure the magnitude or extent of reticle diffraction in the scan direction. Denoted in FIG. 7 at 131 is a slit of a width of about 0.3 mm, and having a length substantially the same as that of the exposure slit. Denoted at 132–136 are photodetectors. Here, the incident light energy upon a peripheral photodetector or detectors becomes stronger with more fine patterns included in the exposure pattern on the reticle.

In the semiconductor exposure apparatus of this embodiment, when a reticle 50 is placed on the reticle stage 52 the first time, the reticle average diffraction rate and the reticle transmissivity are measured. This measurement is performed under the same illumination mode as the practical exposure process (the same stop 35 in the actual exposure). Here, the reticle diffraction sensor 66 of FIG. 7 is held stationary at about a central position in the exposure light flux, and it operates to perform integrated measurement of the light energy impinging thereon during the scan motion of the reticle 50. From the ratio in integration measurement value among the sensors 132–136 of the reticle diffraction sensor 66, the average diffraction rate being set is calculated.

During the measurement, the reticle surface illuminance detector 39 inside the illumination system also operates to perform integration measurement, such that, from the total sum of the integrated outputs of the sensors 132–136 of the reticle diffraction sensor 63 and the ratio in integration measured value of the reticle surface illuminance detector 39, the reticle transmissivity can be calculated. With the measurement operations described above, the reticle average diffraction rate and the reticle transmissivity are obtained. In the semiconductor exposure apparatus of this embodiment, just before initiation of an actual exposure process for a wafer, also the reticle surface illuminance is measured by using the reticle surface illuminance detector 39.

With the operations described above, the reticle average diffraction rate and the reticle transmissivity of the reticle 50, being set, as well as the reticle surface illuminance under the illumination made being currently set, are detected. Thus, a slit shape and an Illuminance distribution in a slit, effective to minimize the exposure astigmatism, can be determined by calculation.

It requires a quite large number of calculations to make this determination. In this embodiment, in consideration of it, at the stage of designing, representative data for the reticle average diffraction rate, the reticle transmissivity and the reticle surface illuminance being calculated in relation to each illumination modes as well as the optimum slit shape and the optimum illuminance distribution inside a slit are prepared beforehand, and they are stored into a memory inside the apparatus control system 72. This enables that, through complementary calculation based on measured values of reticle average diffraction rate, reticle transmissivity and reticle surface illuminance, an optimum slit shape and an optimum illuminance distribution in a slit are determined easily.

Once the optimum slit shape and optimum illuminance distribution inside a slit are determined, corresponding data is supplied from the apparatus control system 72 to the illumination system control 71. In response, the illumination system control 71 actuates the motors 110–113 and 120–123 for the variable slit 43 of FIG. 3, by which an optimum slit shape is defined. Also, through actuation of the motor 37 of the second zoom lens 36, an optimum illuminance distribution inside a slit can be accomplished.

After the operation described above, in the semiconductor exposure apparatus of this embodiment, the reticle stage 52 is moved to move a transparent dummy reticle 51 into the illumination region. Then, by using the illuminance non-uniformness detector 64, the accomplishment of the optimum slit shape and the optimum illuminance distribution in a slit is measured.

The illuminance non-uniformness detector 64 comprises a linear CCD sensor having a long measurement range in the scan direction. It is moved to the image plane position, where it measures the light energy distribution at a single point on the slit, along the scan direction. Thereafter, similar measurement is performed at plural points on the slit, to check the accomplishment of the optimum value. If there is an error found, fine adjustment of the variable slit 43 and/or the second zoom lens 36 is performed.

As a matter of course, for making uniform the integrated exposure amount along the scan direction, the light energy distribution in the scan direction thus accomplished provides the same value at any slit position, when integrated in the scan direction.

After the above-described setting operations are completed, the reticle stage is moved back to the scan start position. Then, the reticle reflection light measurement for "(H) High-precision control of integrated exposure amount" to be described below, starts.

In this embodiment, for further minimization of a change of exposure astigmatism, even during the exposure process the total energy applied to the projection lens 60 is calculated from the output value of the photodetector 39 and the reticle transmission factor, and fine adjustment of the optimum slit illumination shape and optimum light energy distribution is performed automatically during the exposure process. Further, in the semiconductor exposure apparatus of this embodiment, the microscope 47 shown in FIG. 1 is inserted into the exposure region at regular time intervals, and longitudinal and lateral patterns on the reference mark block mounted on the θ-Z stage 63 are measured by using the CCD camera 49. On the basis of it, whether the exposure astigmatism is held within the tolerable range can be checked.

(H) High-precision Control of Integrated Exposure Amount:

In the semiconductor exposure apparatus of this embodiment, after the slit shape and the illuminance distribution inside a slit are determined, for "(G) Reducing astigmatism aberration" described above, reticle reflection light measurement necessary for performing integrated exposure amount control at a high precision, starts. The reticle reflection light measurement and an actual exposure operation will be described below.

(1) From the illumination system control 71, an energization signal to be supplied to the i-line lamp 1 is applied to the lighting device 2. The lighting device 2 supplies the power to the i-line lamp 1.

(2) Subsequently, the reticle stage 52 is moved to the scan start position. A measured value of the reticle surface illuminance detector 39 at that time is memorized as a reference illuminance. Here, the structure is arranged so that, it the reticle stage 52 is at the scan start position, the light from the illumination system does not return back to the illumination system. Namely, it is in the state that any reticle reflection light does not at all return to the reticle illuminance detector 39.

(3) The reticle stage 52 is scanningly moved through the whole exposure region, at a speed sufficiently slower than that in an ordinary exposure process. The measured values of the reticle surface illuminance detector 39 at each reticle position are stored into a memory inside the illumination system control 71.

(4) The CPU inside the illumination system control 71 performs subtraction of the measured value, having been measured at step (2) above, from the measured values of the reticle surface illuminance detector 39 in relation to the different positions of the reticle. The results are stored into the memory in relation to the reticle positions, respectively, as reticle reflection measured values.

(5) After completion of the measurements described above, an actual wafer exposure process starts in the semiconductor exposure apparatus of this embodiment. In the actual wafer exposure process, first, in parallel to wafer loading, an operation similar to Item (2) above is executed, and a current reticle surface illuminance is measured. From this reticle surface illuminance, the scan speed necessary for attaining a desired exposure amount is determined. Also, the ratio between the reticle surface illuminance and the reference illuminance, having been determined at step (2), is calculated. From this ratio, correction for the reticle reflection light measured value having been detected at step (4) is calculated. The result is stored into the memory, in relation to each reticle positions, as a current reticle reflection light measured value.

(6) After the operations described above, in the semiconductor exposure apparatus of this embodiment, processes such as prealignment measurement, fine alignment measurement and focus measurement, for example, are performed. Thereafter, the scan exposure operation starts, such that the reticle 50 and the wafer 61 are scanningly moved in opposite directions, as depicted by an arrow illustrated, at a speed ratio corresponding to the reduction ratio of the projection system 60, whereby the whole pattern on the reticle 50 surface is transferred to a single chip region on the wafer 61.

(7) As the scan exposure operation stars and when the stages come just close to the exposure region, the high-speed exposure shutter 7 is opened.

(8) As the high-speed exposure shutter 7 is opened, measurement of the reticle surface illuminance through the reticle surface illuminance detector 39 is enabled. Here, in the semiconductor exposure apparatus of this embodiment, the measured value of the reticle surface illuminance detector 39 is not taken as the reticle surface illuminance. Rather, a value obtainable by subtracting, from this measured value, the reticle reflection light measured value at each current reticle positions, is taken as the reticle surface illuminance. The electric power control with the lighting device 2 is made so that the thus determined value is constantly registered with the current reticle surface illuminance having been memorized at step (5). This operation is continued, during the scan exposure operation.

(9) When the scan exposure operation is completed, the power specifying signal to the lighting device 2 is held fixed at an applied power value, as specified at step (1), and the high-speed exposure shutter 7 is closed.

With the operations described above, an exposure process for one shot is completed. By repeating similar operations, scan exposure of the whole wafer surface is accomplished.

[Modified Form]

The above-described embodiment may be modified as follows, for example:

(1) A method based on "correction with the reticle reflection light detector 41" has been described in the introductory part of the specification.

(2) If the reticle transmissivity is high and the wafer reflectivity is high, there may be cases in which the influence of reflection light from a wafer appears on the reticle surface illuminance detector 39. On that occasion, the method described with reference to the above embodiment may be done similarly, while a reflection plate having substantially the same reflection factor as that of an actual wafer is disposed at the wafer position.

(3) While the above-described embodiment uses continuous light, the present invention is easily applicable to a semiconductor exposure apparatus using a pulse light source such as an excimer laser, for example.

[Embodiment of Device Manufacturing Method]

Next, an embodiment of a semiconductor device manufacturing method which uses a semiconductor exposure apparatus shown in FIG. 1, will be explained.

Figure 11:
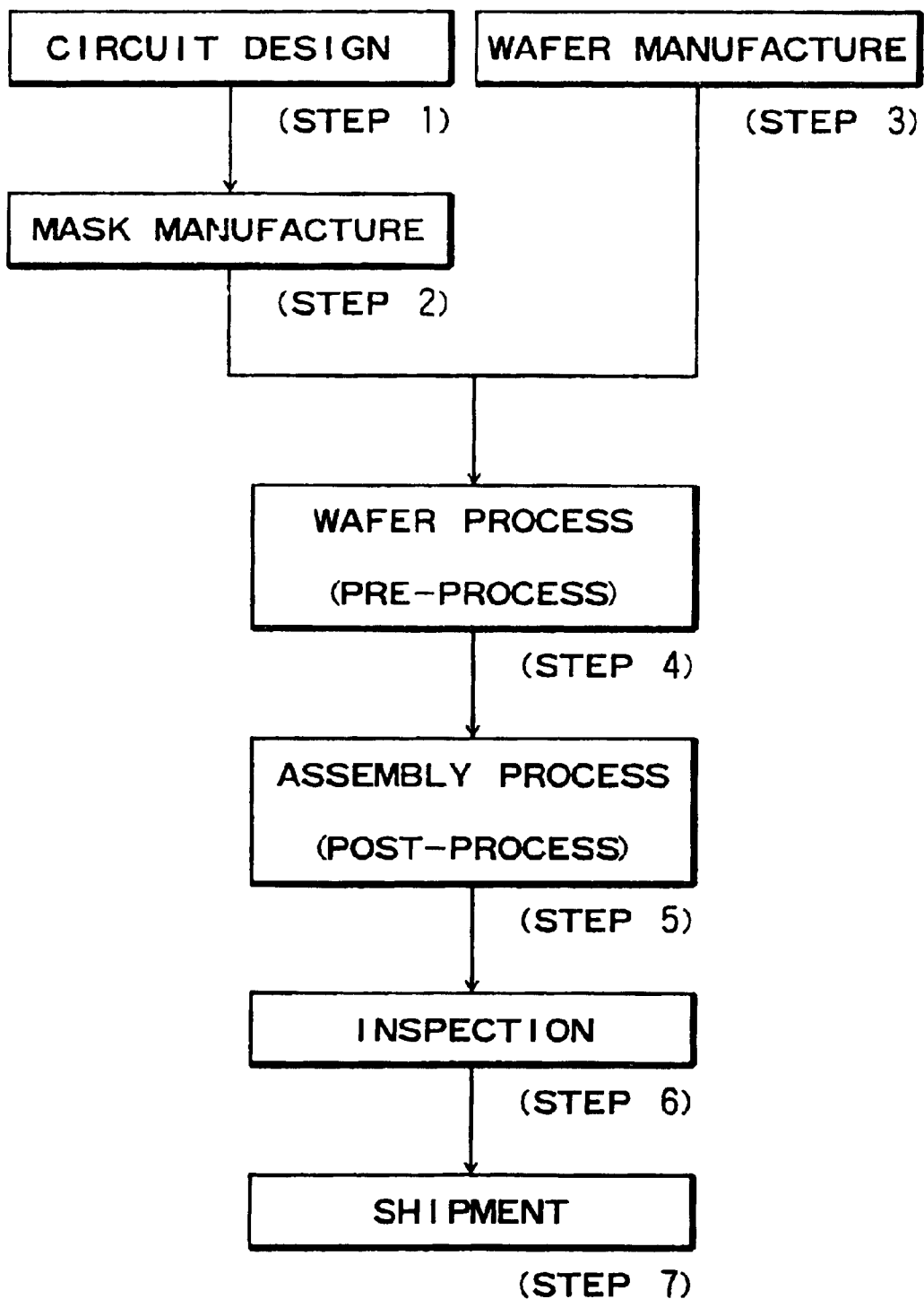
FIG. 11 is a flow chart of semiconductor device manufacturing processes in which an exposure apparatus according to the present invention can be used.

FIG. 11 is a flow chart of a procedure for the manufacture of microdevices such as semiconductor chips (e.g., ICs or LSIs), liquid crystals panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 12:
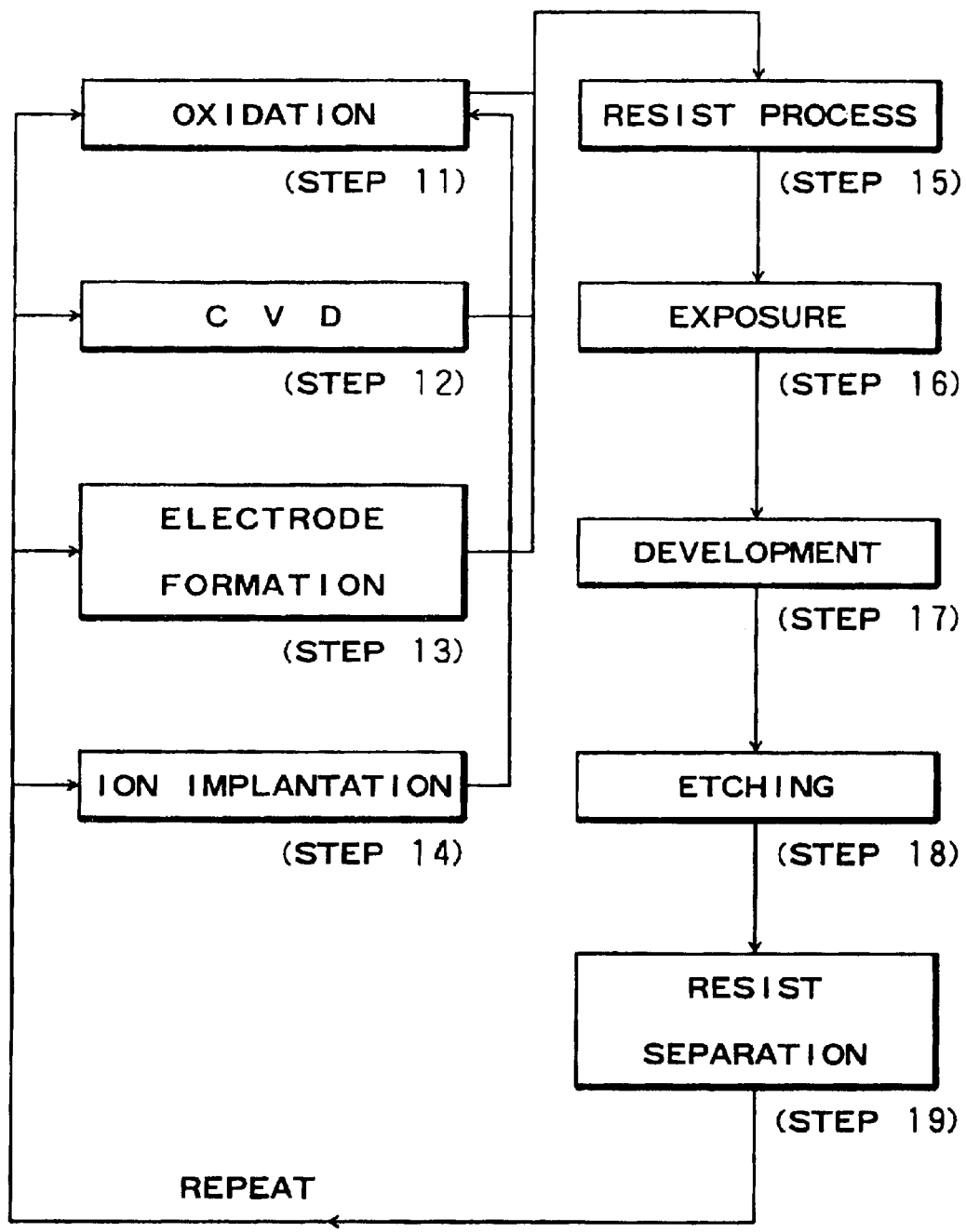
FIG. 12 is a flow chart, for explaining details of a wafer process included in the procedure of FIG. 11.
Figure 13:
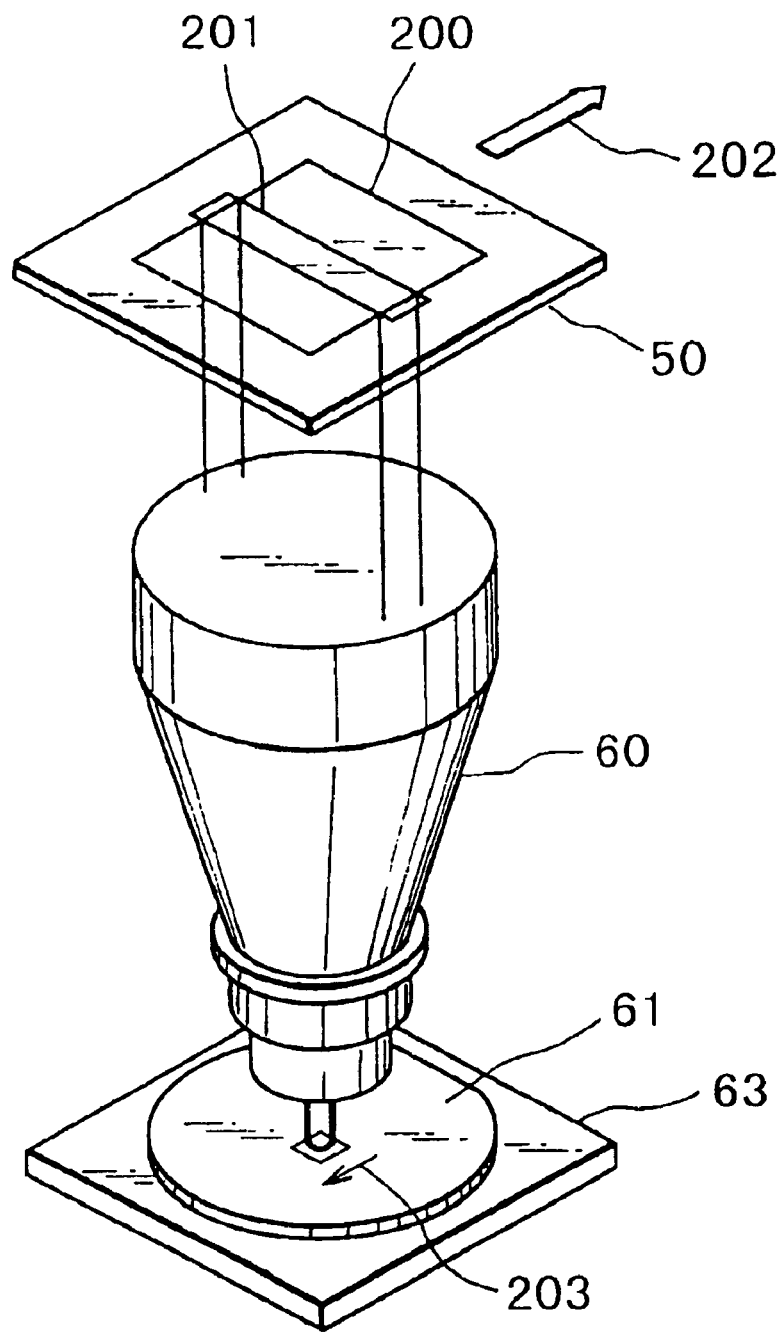
FIG. 13 is a schematic view of a conventional semiconductor exposure apparatus.

FIG. 12 is a flow chart showing details of the wafer process.

Step 11 is an oxidation process for oxidizing the surface of a water. Step 12 is a CVD process for forming an insulating film on the water surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image Step 19 is a resist separation process for separating the resist material remaining on the water after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A scan type exposure apparatus wherein a pattern of an original is lithographically transferred to a substrate sequentially while the original and the substrate are scanningly moved relative to exposure light, said apparatus comprising:

an illumination optical system for illuminating an original with exposure light output from a light source;

a projection optical system for projecting a pattern of the original, illuminated by the illumination optical system, onto a substrate;

a photodetector disposed in said illumination optical system and at a position optically conjugate with the original, for detecting a quantity of light illuminating the original;

control means for controlling the exposure light output from the light source on the basis of the output of the photodetector; and correcting means for reducing an influence of reflection light from the original, on the basis of the output of the photodetector as the original is illuminated by the illumination optical system, while excluding influence of a reflection light component.

2. An apparatus according to claim 1, wherein said correcting means operates to reduce or remove the influence of the reflection light, while referring to the output of said photodetector in a state in which the original is illuminated by said illumination optical system and in which there is no reflection light coming from the original and directed back to said photodetector.

3. An apparatus according to claim 2, wherein said light source comprises a discharge lamp, said correcting means operates so that (i) outputs of said photodetector in relation to each movement position are obtained beforehand while an applied electric power to said discharge lamp is kept constant and while the scan motion is performed at a speed lower than an ordinary scan speed, (ii) during the procedure in (i), the output of said photodetector in a state in which there is no light coming from the original and directed to said photodetector is obtained, (iii) in actual exposure of the substrate, at a start of the scan motion, an output of said photodetector in a state in which there is no reflection light coming from the original and directed back to said photodetector is obtained, and (iv) at each of the movement positions in the scan motion, any influence of reflection light is removed or reduced on the basis of the output in (iv) and the outputs having been obtained beforehand, and said control means controls, at each of the movement positions in the scan motion, the exposure light output from said light source on the basis of an output of said photodetector with the influence of reflection light being removed or reduced.

4. An apparatus according to claim 1, wherein said correcting means includes reflection light detecting means for detecting reflection light from the original, as illuminated by said illumination optical system, and being directed back to said illumination optical system, and wherein said correcting means operates to reduce or remove the influence of the reflection light, while referring to a result of the detection by said reflection light detecting means.

5. An apparatus according to claim 4, wherein said light source comprises a discharge lamp, said correcting means operates so that (i) outputs of said photodetector and outputs of said reflection light detecting means in relation to each movement position are obtained beforehand while an applied electric power to said discharge lamp is kept constant and while the scan motion is performed at a speed lower than an ordinary scan speed, and (ii) in actual exposure of the substrate, at each of the movement positions in the scan motion, any influence of reflection light is removed or reduced on the basis of the output of said photodetector and a result of detection by said reflection light detecting means, and said control means controls, at each of the movement positions in the scan motion, the output of said light source on the basis of an output of said photodetector with the influence of reflection light being removed or reduced.

6. An exposure apparatus, comprising:

an illumination optical system for illuminating an original with exposure light output from a light source;

a projection optical system for projecting a pattern of the original, illuminated by the illumination optical system, onto a substrate;

a photodetector disposed in said illumination optical system, for detecting a quantity of light illuminating the original;

control means for controlling the exposure light output from the light source on the basis of the output of the photodetector; and correcting means for reducing an influence of reflection light from the original, on the basis of the output the photodetector as the original is illuminated by the illumination optical system, while excluding influence of a reflection light component.

7. An apparatus according to claim 6, wherein said correcting means operates to reduce or remove the influence of the reflection light, while referring to the output of said photodetector in a state in which the original is illuminated by said illumination optical system and in which there is no reflection light coming from the original and directed back to said photodetector.

8. An apparatus according to claim 7, wherein said exposure apparatus is a scan type exposure apparatus in which exposure is performed while the original and the substrate are scanningly moved relative to the exposure light from said illumination optical system and relative to said projection optical system, wherein said light source comprises a discharge lamp, said correcting means operates so that (i) outputs of said photodetector in relation to each movement position are obtained beforehand while an applied electric power to said discharge lamp is kept constant and while the scan motion is performed at a speed lower than an ordinary scan speed, (ii) during the procedure in (i), the output of said photodetector in a state in which there is no light coming from the original and directed to said photodetector is obtained, (iii) in actual exposure of the substrate, at a start of the scan motion, an output of said photodetector in a state in which there is no reflection light coming from the original and directed back to said photodetector is obtained, and (iv) at each of the movement positions in the scan motion, any influence of reflection light is removed or reduced on the basis of the output in (iv) and the outputs having been obtained beforehand, and said control means controls, at each of the movement positions in the scan motion, the exposure light output from said light source on the basis of an output of said photodetector with the influence of reflection light being removed or reduced.

9. An apparatus according to claim 6, wherein said correcting means includes reflection light detecting means for detecting reflection light from the original, as illuminated by said illumination optical system, and being directed back to said illumination optical system, and wherein said correcting means operates to reduce or remove the influence of the reflection light, while referring to a result of the detection by said reflection light detecting means.

10. An apparatus according to claim 9, wherein said exposure apparatus is a scan type exposure apparatus in which exposure is performed while the original and the substrate are scanningly moved relative to the exposure light from said illumination optical system and relative to said projection optical system, wherein said light source comprises a discharge lamp, said correcting means operates so that (i) outputs of said photodetector and outputs of said reflection light detecting means in relation to each movement position are obtained beforehand while an applied electric power to said discharge lamp is kept constant and while the scan motion is performed at a speed lower than an ordinary scan speed, and (ii) in actual exposure of the substrate, at each of the movement positions in the scan motion, any influence of reflection light is removed or reduced on the basis of the output of said photodetector and a result of detection by said reflection light detecting means, and said control means controls, at each of the movement positions in the scan motion, the output of said light source on the basis of an output of said photodetector with the influence of reflection light being removed or reduced.

11. An apparatus according to claim 6, wherein said exposure apparatus is a scan type exposure apparatus in which exposure is performed while the original and the substrate are scanningly moved relative to the exposure light from said illumination optical system and relative to said projection optical system, wherein said correcting means is operable to reduce or remove any influence of the reflection light at each movement position in the scan motion, and said control means is operable to control the exposure light output from said light source on the basis of the output of said photodetector, with the influence of the reflection light at each of the movement positions in the scan motion being reduced or removed.

12. A scan type exposure apparatus, comprising:
an illumination optical system for illuminating an original, in a predetermined shape, with light from a light source;
a projection optical system for projecting a pattern of the original, illuminated by said illumination optical system, onto a substrate;
a photodetector disposed inside said illumination optical system, for detecting a quantity of illumination light in said illumination optical system and for providing an output of illumination light quantity information in relation to each operative position in scan motion;
first control means for controlling output of the light source in accordance with each output of said photodetector;
storing means for reducing or removing, in relation to different positions on the original illuminated in the predetermined shape, a component of reflection light from the original included in the photodetector output, and for holding correction information for calculation of an illumination light quantity solely from the light source;
calculating means for receiving correction information held by said storing means and for receiving illumination light quantity information from said photodetector in each operative position in the scan motion, to calculate, in accordance with the correction information, information on illumination light quantity solely from the light source, without being influenced by the reflection light component; and
second control means for receiving the information of illumination light quantity solely from the light source, calculated by said calculating means, to control output of exposure light from the light source so that, at each operative position in the scan motion, the illumination light quantity solely from the light source is kept at a predetermined value.

13. An apparatus according to claim 12, wherein, in a state in which, before an actual exposure operation, the light source is not controlled on the basis of the photodetector output, said storing means receives information of illumination light quantity in said illumination optical system from said photodetector, at each operative position in the scan motion, to produce correction information in relation to each operative position of the scan motion.

14. A scan type exposure apparatus, comprising:
an illumination optical system for illuminating an original, in a predetermined shape, with light from a light source;
a projection optical system for projecting a pattern of the original, illuminated by said illumination optical system, onto a substrate;
a first photodetector disposed inside said illumination optical system, for detecting a quantity of illumination light in said illumination optical system and providing an output of illumination light quantity information in relation to each operative position in scan motion;
a second photodetector for detecting a quantity of reflection light from the original and providing an output of information of reflection light quantity from the original at each operative position in the scan motion;
calculating means for calculating an illumination light quantity solely from the light source, on the basis of the illumination light quantity information from said first photodetector and the reflection light quantity information from said second photodetector;
correction means for receiving an output of said calculating means and receiving, at each operative position of the scan motion, illumination light quantity information from said first photodetector and reflection light quantity information from said second photodetector, to calculate information of illumination light quantity solely from the light source while excluding influence of a reflection light component on the basis of the output; and
control means for receiving the information of illumination light quantity solely from the light source, with the influence of reflection light component being excluded, on the basis of an output of said correction means, and to control output of exposure light from the light source so that, at each operative position in the scan motion, the illumination light quantity solely from the light source is kept at a predetermined value.

15. An apparatus according to claim 14, wherein, in a state in which, before an actual exposure operation, the light source is not controlled on the basis of outputs of said first and second photodetectors, said calculating means receives information of illumination light quantity in said illumination optical system and information of reflection light quantity from said first and second photodetectors, at each operative position in the scan motion, to calculate a ratio between an amount of change in the illumination light quantity information and an amount of change in reflection light quantity information, and wherein said calculating means calculates, in an actual exposure operation, the illumination light quantity solely from the light source on the basis of the calculated ratio.

16. A scan type exposure apparatus wherein a pattern of an original is lithographically transferred to a substrate sequentially while the original and the substrate are scanningly moved relative to exposure light, said apparatus comprising:

an illumination optical system for illuminating an original with exposure light output from a light source;

a projection optical system for projecting a pattern of the original, illuminated by the illumination optical system, onto a substrate;

a photodetector, disposed in said illumination optical system, for detecting a quantity of light illuminating the original;

control means for controlling the exposure light output from the light source on the basis of the output of the photodetector; and correcting means for reducing an influence of reflection light from the original, on the basis of the output of the photodetector as the original is illuminated by the illumination optical system, while excluding influence of a reflection light component.

17. An apparatus according to claim 16, wherein said correcting means operates to reduce or remove the influence of the reflection light, while referring to the output of said photodetector in a state in which the original is illuminated by said illumination optical system and in which there is no reflection light coming from the original and directed back to said photodetector.

18. An apparatus according to claim 17, wherein said light source comprises a discharge lamp, said correcting means operates so that (i) outputs of said photodetector in relation to each movement position are obtained beforehand while an applied electric power to said discharge lamp is kept constant and while the scan motion is performed at a speed lower than an ordinary scan speed, (ii), during the procedure in (i), the output of said photodetector in a state in which there is no light coming from the original and directed to said photodetector is obtained, (iii) in actual exposure of the substrate, at a start of the scan motion, an output of said photodetector in a state in which there is no reflection light coming from the original and directed back to said photodetector is obtained, and (iv) at each of the movement positions in the scan motion, any influence of reflection light is removed or reduced on the basis of the output in (iv) and the outputs having been obtained beforehand, and said control means controls, at each of the movement positions in the scan motion, the exposure light output from said light source on the basis of an output of said photodetector with the influence of reflection light being removed or reduced.

19. An apparatus according to claim 16, wherein said correcting means includes reflection light detecting means for detecting reflection light from the original, as illuminated by said illumination optical system, and being directed back to said illumination optical system, and wherein said correcting means operates to reduce or remove the influence of the reflection light, while referring to a result of the detection by said reflection light detecting means.

20. An apparatus according to claim 19, wherein said light source comprises a discharge lamp, said correcting means operates so that (i) outputs of said photodetector and outputs of said reflection light detecting means in relation to each movement position are obtained beforehand while an applied electric power to said discharge lamp is kept constant and while the scan motion is performed at a speed lower than an ordinary scan speed, and (ii) in actual exposure of the substrate, at each of the movement positions in the scan motion, any influence of reflection light is removed or reduced on the basis of the output of said photodetector and a result of detection by said reflection light detecting means, and said control means controls, at each of the movement positions in the scan motion, the output of said light source on the basis of an output of said photodetector with the influence of reflection light being removed or reduced.

* * * * *

UNITED STATES PATENT AND TRADEMARK OFFICE
CERTIFICATE OF CORRECTION

PATENT NO. : 6,888,618 B2
APPLICATION NO. : 09/472993
DATED : May 3, 2005
INVENTOR(S) : Mitsuya Sato It is certified that error appears in the above-identified patent and that said Letters Patent is hereby corrected as shown below:

ON THE TITLE PAGE:
    Under item "(*) Notice:" insert the following paragraph.

-- This patent issued on a continued prosecution application filed under 37 CFR 1.53(d), and is subject to the twenty year patent term provisions of 35 U.S.C. 154(a)(2). --

COLUMN 2:
    Line 64, "FIG. 1" should read -- FIG. 1. --.

COLUMN 4:
    Line 8, "It" should read -- If --.
    Line 58, "lamp 1" should read -- lamp 1. --
    Line 67, "a" should read -- an --.

COLUMN 7:
    Line 5, "Idealistically," should read -- Ideally, --.
    Line 52, "memory" should read -- memory. --

UNITED STATES PATENT AND TRADEMARK OFFICE
CERTIFICATE OF CORRECTION

PATENT NO. : 6,888,618 B2
APPLICATION NO. : 09/472993
DATED : May 3, 2005
INVENTOR(S) : Mitsuya Sato It is certified that error appears in the above-identified patent and that said Letters Patent is hereby corrected as shown below:

COLUMN 8:
 Line 15, "can not" should read -- cannot --.
 Line 37, "lamp" should read -- lamp. --

COLUMN 9:
 Line 5, "jobs." should read -- job. --.

COLUMN 10:
 Line 11, "met" should read -- set --.

COLUMN 13:
 Line 18, "it" should read -- if --.

COLUMN 15:
 Line 6, "image" should read -- image. -- and "water" should read -- wafer --.

Signed and Sealed this

Twenty-fifth Day of July, 2006

JON W. DUDAS
*Director of the United States Patent and Trademark Office*